US010074427B2

(12) United States Patent
Alrod et al.

(10) Patent No.: US 10,074,427 B2
(45) Date of Patent: Sep. 11, 2018

(54) SHAPED DATA ASSOCIATED WITH AN ERASE OPERATION

(71) Applicant: SANDISK TECHNOLOGIES LLC, Plano, TX (US)

(72) Inventors: Idan Alrod, Herzliya (IL); Noam Presman, Givatayim (IL); Ariel Navon, Revava (IL); Tz-Yi Liu, Palo Alto, CA (US); Tianhong Yan, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/539,033

(22) Filed: Nov. 12, 2014

(65) Prior Publication Data
US 2016/0133324 A1    May 12, 2016

(51) Int. Cl.
*G11C 13/00* (2006.01)
*G11C 7/10* (2006.01)

(52) U.S. Cl.
CPC ........ *G11C 13/0097* (2013.01); *G11C 7/1006* (2013.01); *G11C 13/004* (2013.01); *G11C 13/0033* (2013.01); *G11C 13/0069* (2013.01); *G11C 2013/0085* (2013.01); *G11C 2213/77* (2013.01)

(58) Field of Classification Search
CPC ... G11C 13/0097; G11C 13/00; G11C 13/004; G11C 13/0069; G11C 13/0002; G11C 13/0007–13/0014; G11C 11/5614; G11C 11/5678; G11C 11/5685
USPC .............................. 365/148, 158, 189.2, 163
See application file for complete search history.

(56) References Cited

U.S. PATENT DOCUMENTS

| 6,218,968 | B1 | 4/2001 | Smeets et al. |
| 8,659,954 | B1 | 2/2014 | Lewis et al. |
| 2006/0168505 | A1* | 7/2006 | Liaw .................. G11C 13/0011 714/823 |
| 2007/0195590 | A1* | 8/2007 | Sugita ............... G11C 13/0007 365/163 |
| 2008/0158948 | A1 | 7/2008 | Sharon et al. |
| 2009/0003040 | A1 | 1/2009 | Stan et al. |
| 2011/0240949 | A1* | 10/2011 | Mitani ................... G11C 11/56 257/4 |

(Continued)

FOREIGN PATENT DOCUMENTS

WO    2010092536 A1    8/2010

OTHER PUBLICATIONS

Invitation to Pay Additional Fees and, Where Applicable, Protest Fee and Partial International Search Report dated Dec. 4, 2015 in International Application No. PCT/US2015/049894, 7 pages.

(Continued)

*Primary Examiner* — Alexander Sofocleous
*Assistant Examiner* — Alfredo Bermudez Lozada
(74) *Attorney, Agent, or Firm* — Kunzler, PC

(57) ABSTRACT

A method includes, in a data storage device including a resistive memory, receiving, from an external device, an erase command to erase a portion of the resistive memory. The method further includes storing shaped data at the portion of the resistive memory responsive to the erase command. Shaped data is configured to control an amount of leakage current during a read and/or write operation at one or more storage elements that are adjacent to at least one storage element of the portion of the resistive memory.

24 Claims, 3 Drawing Sheets

(56) References Cited

U.S. PATENT DOCUMENTS

| | | |
|---|---|---|
| 2013/0024747 A1 | 1/2013 | Sharon et al. |
| 2013/0103891 A1* | 4/2013 | Sharon ................ G06F 12/0246 |
| | | 711/103 |
| 2013/0254498 A1* | 9/2013 | Adachi ................. G06F 9/3004 |
| | | 711/155 |
| 2014/0071751 A1* | 3/2014 | Kim ....................... G11C 16/14 |
| | | 365/185.03 |

OTHER PUBLICATIONS

International Search Report and Written Opinion dated Feb. 9, 2016 in International Application No. PCT/US2015/049894, 18 pages.

* cited by examiner

SHAPED DATA ASSOCIATED WITH AN ERASE OPERATION

FIELD OF THE DISCLOSURE

The present disclosure is generally related to shaping data.

BACKGROUND

Resistance-based random access memory devices use a variable resistive material to store data. The variable resistive material has a resistance that can be changed responsive to a programming voltage. For example, a storage element of a resistance-based random access memory device may be programmed to a first resistance state to indicate storage of a first logical value (e.g., a low resistance state representing a "0" value) and may be programmed to a second resistance state to indicate storage of a second logical value (e.g., a high resistance state representing a "1" value).

Storage elements of a resistance-based random access memory device can be arranged in a three-dimensional structure. In such a structure, each storage element may be placed between a bit line and a word line. For example, a first storage element may be coupled to a first bit line and to a first word line. A second storage element may be coupled to the first bit line and to a second word line. Another storage element may be coupled to a second bit line and the first word line. In this arrangement, to read the first storage element, a read voltage may be applied across the first storage element by applying a first voltage (e.g., a relatively high voltage) to the first bit line and applying a different voltage (e.g., a relatively low voltage) to the first word line. A sense amplifier coupled to the first bit line may sense current (e.g., a "read current") that flows through the first bit line. The current flowing through the first bit line is responsive to the voltage across the first storage element. Thus, the current can be used to determine a resistance state of the first storage element using Ohm's law.

Since the storage elements of the resistance-based random access memory device store logical values based on resistance state, different read currents may indicate different logical values. For example, reading a storage element that is in a low resistance state uses more read current than reading a storage element that is in a high resistance state. Reliability of data storage and retrieval at the resistance-based random access memory device may be impacted due to the resistive network topology of the memory, such as by introducing leakage current during read operations.

SUMMARY

A data storage device includes a memory, such as a resistance-based random access memory (ReRAM), that is configured to store shaped data at a portion of a memory. For example, the shaped data may be stored at the portion of the memory based on an erase command to erase the portion of the memory. By storing the shaped data at the portion of the memory responsive to the erase command, an amount of leakage current experienced during a read or write operation at one or more storage elements that neighbor the portion of the memory (e.g., storage elements adjacent to the portion of the memory) may be controlled.

DETAILED DESCRIPTION

Particular implementations are described with reference to the drawings. In the description, common features are designated by common reference numbers throughout the drawings.

Figure 1:
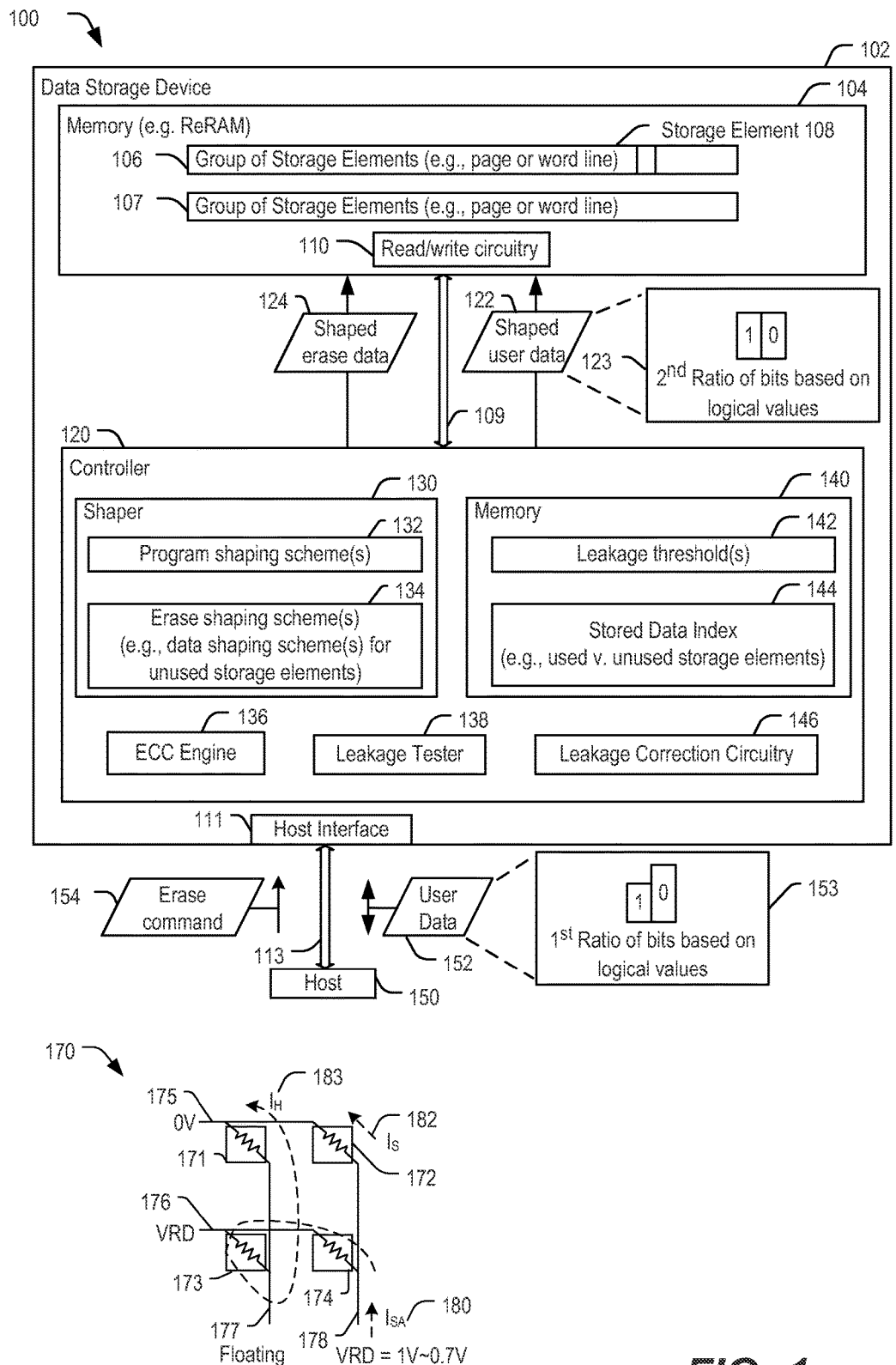
FIG. 1 is a block diagram of a particular illustrative embodiment of a system including a data storage device that stores shaped data responsive to an erase command.

Referring to FIG. 1, a particular illustrative embodiment of a system is depicted and generally designated 100. The system 100 includes a data storage device 102 and a host device 150. The data storage device 102 includes a controller 120 and a memory 104, such as a resistance-based random access memory (ReRAM), and the data storage device 102 is configured to control leakage current during read and/or write operations. For example, the data storage device 102 may store shaped data at one or more storage elements of the memory 104 (e.g., shaped programmed data and/or shaped erase data) to control leakage current and to mitigate effects of the leakage current during the read and/or write operations. Leakage current is "controlled" when the leakage current has a reduced variability and/or a range of values due to the presence of shaped data as compared to a leakage current variability and/or range of values associated with storage elements that store unshaped data.

In some implementations, the data storage device 102 may send shaped erase data 124 to be stored at a portion (e.g., one or more word lines) of the memory 104 based on an erase command 154 to erase the portion of the memory 104 (e.g., to erase the one or more word lines of the memory 104). By sending the shaped erase data 124 to be stored at the portion responsive to the erase command 154, an amount of leakage current of the memory 104 during a read and/or write operation at one or more storage elements that neighbor the portion (e.g., that are adjacent to the portion) may have a reduced variability and/or range of values as compared to leakage current in storage devices in which erase data in storage elements is unshaped. (e.g., data values of storage elements in erase state each store the same data value). For example, in a storage device where all "erased" or unused storage elements are in a low-resistance state, leakage current resulting from reading data from storage elements that are adjacent to erased storage elements may be significantly greater than leakage current resulting from reading data form storage elements that are adjacent to storage elements storing shaped user data.

To illustrate, an amount of leakage current experienced during the read and/or write operation at a storage element may vary based on a state (e.g., a low-resistance state or a high-resistance state) of one or more neighboring storage elements. For example, a diagram 170 illustrates leakage current experienced during a read operation of a storage element of a 3D ReRAM memory, such as the memory 104. Storage elements 171 and 172 are coupled to a word line 175 and storage elements 173 and 174 are coupled to another word line 176 that is adjacent to the word line 175. The storage elements 171 and 173 are coupled to a bit line 177 and the storage elements 172 and 174 are coupled to another bit line 178 that is adjacent to the bit line 177. When the storage element 172 is selected to be read ("selected storage element"), a read voltage is applied between the bit line 178 ("selected bit line") and the word line 175 ("selected word line"), illustrated as the selected bit line 178 having a read voltage VRD (e.g., in a range between 1 volt and 0.7 volts) and the selected word line 175 coupled to ground (0 volts). The unselected bit line 177 is floating (e.g., not coupled to an external voltage source), and the unselected word line 176 is biased with the read voltage VRD.

A total current $I_{SA}$ 180 through the selected bit line 178 (and/or through the selected word line 175) includes a current $I_s$ 182 through the selected storage element 172 and leakage current through one or more unselected storage elements. The total current $I_{SA}$ 180 may be sensed, such as via a sense amplifier of read/write circuitry 110.

One component $I_H$ 183 of the leakage current follows a leakage current path from the selected bit line 178 through the storage element 174, the unselected word line 176, the storage element 173, the unselected bit line 177, and the storage element 171. $I_H$ 183 results from a voltage VRD across a resistance that is equal to a function of the resistances of the storage elements 171, 173, and 174. $I_H$ 183 is greatest when each of the storage elements 171, 173, and 174 is in a low-resistance state. $I_H$ 183 has a smallest magnitude when each of the storage elements 171, 173, and 174 is in a high-resistance state. Accordingly, a range of an amount of leakage current may vary between (e.g., may be bounded by) a first value associated with each neighboring storage element being in a high-resistance state and a second value associated with each neighboring storage element being in a low-resistance state. Although the diagram 170 illustrates leakage current experienced during a read operation, an amount of leakage current may similarly vary during a program operation (e.g., a write operation) of a particular storage element based on states of storage elements that neighbor the particular storage element.

To control the amount of leakage current experienced during a read and/or write operation of a particular storage element (or group of storage elements), data stored at neighboring storage elements may be shaped such that a first number of the neighboring storage elements are in a high-resistance state and a second number of the storage elements are in a low-resistance state. For example, the shaped data may be associated with a statistical ratio of one or more storage elements that are in a low-resistance state and one or more storage elements in a high-resistance state, as described further herein. In some implementations, an entirety of a memory array (e.g., the memory 104) may store shaped data regardless of whether one or more storage elements of the memory array are unused.

By shaping the data stored at the neighboring storage elements (e.g., throughout the memory 104), the amount of leakage current experienced during the read and/or write operation on the portion of the memory 104 may be controlled to be a predicted and/or expected amount, e.g., to be within a predicted and/or expected range. For example, the predicted and/or expected range may be smaller than a range that varies between (e.g., is bounded by) a first leakage value that corresponds to each neighboring storage element being in a high-resistance state and a second leakage value that corresponds to each neighboring storage element being in a low-resistance state. By controlling the amount of leakage current (using shaped data), leakage current experienced during the read and/or write operation of the particular storage element may be at the predicted and/or expected amount (e.g., within the predicted and/or expected range) and, thus, effects of the leakage current during the programming or reading can be mitigated without having to determine or estimate a specific amount of leakage current for each read and/or write operation. For example, a read and/or write operation may be performed that mitigates a particular amount of leakage current (e.g., by adjusting a reference current or a "trim" of an applied voltage) without having to estimate an amount of leakage current. The particular amount of leakage current may be associated with a predetermined amount of leakage that is predicted and/or expected (e.g., a particular amount of leakage current that is included within a predicted and/or expected range of leakage current) based on shaped data (e.g., for programmed and erased storage elements) stored at the memory 104.

The data storage device 102 and the host device 150 may be operationally coupled via a connection, such as a bus 113 or a wireless connection. The data storage device 102 may be embedded within the host device 150, such as in accordance with a Joint Electron Devices Engineering Council (JEDEC) Solid State Technology Association Universal Flash Storage (UFS) configuration. Alternatively, the data storage device 102 may be removable from the host device 150 (i.e., "removably" coupled to the host device 150). As an example, the data storage device 102 may be removably coupled to the host device 150 in accordance with a removable universal serial bus (USB) configuration.

The memory 104 of the data storage device 102 may include a non-volatile memory, such as ReRAM. The memory 104 may have a three-dimensional (3D) memory configuration. Alternatively, the memory 104 may have another configuration, such as a two-dimensional (2D) memory configuration. An example of a 3D ReRAM configuration that may be implemented in the data storage device 102 is described in further detail with respect to FIG. 2.

The memory 104 may include one or more physical pages of storage elements (e.g., one or more word lines of storage elements). The physical pages may be included in one or more blocks (e.g., a logical or physical group of word lines) of the memory 104. The memory 104 may include multiple blocks of physical pages. The memory 104 may include one or more representative groups of storage elements 106, 107. For example, the representative group of storage elements 106 may represent a physical page and may be sized to store an error correction code (ECC) codeword. As another example, the group of storage elements 106 may include multiple physical pages. The group of storage elements 106 includes a representative storage element 108, such as a ReRAM cell. In some implementations, the group of storage elements 106 may correspond to a first portion (e.g., two or more storage elements) of the memory 104 and the group of storage elements 107 may correspond to a second portion (e.g., two or more storage elements) of the memory 104.

The memory 104 may include support circuitry to support operation of storage elements (e.g., the groups of storage elements 106, 107), such as read/write circuitry 110. Although depicted as a single component, the read/write circuitry 110 may be divided into separate components of the memory 104. The read/write circuitry 110 may be external to one or more memory dies of the memory 104. Alternatively, each memory die may include corresponding read/write circuitry that is operable to read from and/or write to storage elements within each individual memory die independent of any other read and/or write operations at any of the other memory dies.

The controller 120 is configured to receive data and instructions from the host device 150 and to send data to the host device 150. For example, the controller 120 may send data to the host device 150 via a host interface 111 and may receive data from the host device 150 via the host interface 111. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is configured to send a read command to the memory 104 to access data from a specified address of the memory 104. The read command may specify the physical address of a portion of the memory 104 (e.g., a physical address of a word line of the memory 104).

The controller 120 may include a memory 140, a shaper 130, an ECC engine 136, a leakage tester 138, and leakage correction circuitry 146. The shaper 130 is configured to generate shaped data, as described further herein. To generate the shaped data, the shaper 130 may include one or more program shaping schemes 132 (e.g., one or more data shaping schemes for used storage elements) and one or more erase shaping schemes 134 (e.g., one or more data shaping schemes for unused storage elements). Although the shaper 130 is illustrated as having different shaping schemes for user data shaping and for erase shaping, in other implementations the shaper 130 may use the same shaping scheme(s) for user data shaping (to program data, such as the user data 152, to the memory 104) and for erase shaping.

The controller 120 may be configured to receive data, such as user data 152, from the host device 150 to be stored at the memory 104. For example, the host device 150 may request the controller 120 to store the user data 152 at a first portion of the memory 104 (e.g., at the group of storage elements 106). The user data 152 may be represented as a first set of bits, where each bit corresponds to a logical value. The shaper 130 may apply a program shaping operation on the user data 152 (or an encoded version thereof generated by the ECC engine 136) to generate shaped user data 122 including a second set of bits. The first set of bits may have a first ratio of bits 153 based on logical values of the first set of bits, and the second set of bits may have a second ratio of bits 123 based on logical values of the second set of bits. As a result of the program shaping operation, the first ratio of bits 153 may be different than the second ratio of bits 123. For example, the first ratio of bits 153 may indicate that the first set of bits has more bit values that are a logical "0" value than bit values that are a logical "1" value. However, the second ratio of bits 123 may indicate that the second set of bits has approximately equal numbers of bit values that are the logical "0" value and bit values that are the logical "1" value. Although the shaped user data 122 is illustrated as having the second ratio of bits 123 having approximately equal numbers of bits that are the logical "0" value and the logical "1" value, in other implementations, the second ratio of bits 123 may not have approximately equal numbers of bits that are the logical "0" value and the logical "1" value.

In some implementations, a particular program shaping scheme 132 used to generate the shaped user data 122 may include mapping a set of bits corresponding to a set of logical values of the user data 152 to a second set of bits corresponding to a different set of logical values to form the shaped user data 122, as an illustrative, non-limiting example. The controller 120 may store a key or mapping table to enable un-shaping of the shaped user data 122 to recreate the user data 152 during a subsequent read operation.

The controller 120 may be configured to receive an erase command 154 from the host device 150 to erase a portion of the memory 104. For example, the host device 150 may request the controller 120 to erase a second portion of the memory 104 (e.g., the group of storage elements 107). The shaper 130 may apply a shaping operation based on the one or more erase shaping schemes 134 to generate shaped erase data 124 including a third set of bits. The third set of bits may have a third ratio of bits that is based on logical values of the third set of bits. The third ratio of bits may be the same as the second ratio of bits 123 or may be different than the second ratio of bits 123.

In some implementations, the shaper 130 may generate the shaped erase data 124 based on a ratio of a first number of bits having a first bit value and a second number of bits having a second bit value, where each of the first number and the second number is greater than zero. For example, the first bit value may be associated with a low-resistance state and the second bit value may be associated with a high-resistance state. Alternatively, or in addition, the shaper 130 may generate the shaped erase data 124 based on a predetermined pattern of first storage elements of the memory 104 being in a low-resistance state and second storage elements of the memory 104 being in a high-resistance state. In other implementations, the shaper 130 may generate the shaped erase data 124 based on a pseudo-random sequence of data values. For example, the shaper 130 may include or be coupled to a random number generator that is configured to generate the pseudo-random sequence of data values to have a first statistical number of storage elements in a low-resistance state and a second statistical number of storage elements in a high-resistance state. In a particular implementation, the pseudo-random sequence of data values is used as the shaped erase data 124. Alternatively, a bit-wise logical operation (e.g., XOR) may be used to modify the pseudo-random number sequence of data values based on data stored at a location of the memory 104 to be erased in order to generate the shaped erase data 124.

The memory 140 may include a random access memory (RAM). Alternatively, or in addition, the memory 140 may include another type of memory, such as a non-volatile memory. The memory 140 may be used to store data that is utilized during reading and/or decoding operations performed on data stored at the memory 104. For example, the memory 140 may include one or more leakage thresholds 142 and a stored data index 144. The one or more leakage thresholds 142 may be used by the leakage tester 138, as described further herein. The stored data index 144 may include a data structure (e.g., a table) that indicates which storage elements of the memory 104 are used (e.g., store valid user data) and which storage elements of the memory are unused (e.g., do not store valid user data and/or are associated with an erase state). To illustrate, the stored data index 144 may indicate that the group of storage elements 106 are used to store user data, such as the user data 152 (e.g., the shaped user data 122), and that the group of storage elements 107 are unused (e.g., the group of storage elements 107 include erase data, such as the shaped erase data 124).

The leakage tester 138 may be configured to determine an estimated amount of leakage associated with shaped data stored at the memory 104, such as the shaped user data 122 or the shaped erase data 124. To illustrate, after the shaped user data 122 is stored at the group of storage elements 106, the leakage tester 138 may apply a bias voltage to a bit line and/or a word line corresponding to the group of storage elements 106 and may determine (e.g., sense) a bias current. The bias current may be associated with an estimated amount of leakage current. The leakage tester 138 may compare the bias current to a leakage threshold value of the one or more leakage thresholds 142. If the bias current is greater than or equal to the threshold value, the leakage tester 138 may initiate the shaper 130 to reshape the shaped user data 122 stored at the group of storage elements 106. The shaped user data 122 stored at the group of storage elements 106 may be reshaped using the same program shaping scheme used to generate the shaped user data 122 or using a different program shaping scheme. Alternatively or in addition, if the bias current is greater than or equal to the threshold value, the leakage tester 138 may notify the leakage correction circuitry 146 to perform one or more operations to measure (e.g., estimate) and/or correct for effects of leakage current when performing a read operation or a program operation at a storage element included in the group of storage elements 106 or at a storage element that neighbors the group of storage elements 106.

As another example, after the shaped erase data 124 is stored at the group of storage elements 107, the leakage tester 138 may apply a bias voltage to a bit line and/or a word line corresponding to the group of storage elements 107 and may determine (e.g., sense) a bias current that is associated with an estimated amount of leakage current. The leakage tester 138 may compare the bias current to a leakage threshold value of the one or more leakage thresholds 142. If the bias current is greater than or equal to the threshold value, the leakage tester 138 may initiate the shaper 130 to reshape the shaped erase data 124 stored at the group of storage elements 107. The shaped erase data 124 stored at the group of storage elements 107 may be reshaped using the same erase shaping scheme used to generate the shaped erase data 124 or using a different erase shaping scheme. Alternatively, if the bias current is greater than or equal to the threshold value, the leakage tester 138 may reshape the stored shaped erase data 124 by changing a value of one or more storage elements of the group of storage elements 107. After reshaping the shaped erased data 124, the leakage tester 138 may be configured to retest an estimated amount of leakage current associated with the group of storage elements 107. In the event that the estimated amount of leakage current associated with a storage element of the group of storage elements 107 fails a number of tests (e.g., one test, two tests, three tests, or more than three tests, as illustrative examples), the leakage tester 138 may notify the leakage correction circuitry 146.

The ECC engine 136 may indicate a number of detected errors in data that is read using a single phase read operation, and the number of detected errors may be used to determine whether a two phase read operation is to be used to re-read the data. The ECC engine 136 is configured to receive data and to generate one or more ECC codewords based on data to be stored at the memory 104, such as the user data 152. The ECC engine 136 may include an encoder and a decoder. For example, the encoder may be configured to encode data using a low-density parity check (LDPC) encoding technique. The encoder may include a Hamming encoder, a Reed-Solomon (RS) encoder, a Bose-Chaudhuri-Hocquenghem (BCH) encoder, an LDPC encoder, a turbo encoder, an encoder configured to encode data according to one or more other ECC techniques, or a combination thereof. The ECC engine 136 is configured to decode data accessed from the memory 104. For example, the decoder within the ECC engine 136 may be configured to decode data accessed from the memory 104 to detect and correct one or more errors that may be present in the read data, up to an error correcting capacity of the particular ECC scheme.

The leakage correction circuitry 146 may be configured to perform a two phase read and/or write operation to estimate and cancel effects of leakage current. For example, the leakage correction circuitry 146 may perform the two phase read and/or write operation based on a notification by the leakage tester 138 that one or more storage elements (and/or one or more neighboring storage elements) did not pass a test performed by the leakage tester 138. As another example, the leakage correction circuitry 146 may perform the two phase read operation based on an indication from the ECC engine 136 that the ECC engine 136 was unable to decode data read from the memory 104. To illustrate, data read from the memory 104 using the single phase read operation may be provided to the ECC engine 136 for error correction. The controller 120 may compare an output of the ECC engine 136 that indicates a number of errors in the read data to an error threshold. In response to the number of errors exceeding the error threshold, the controller 120 may initiate a two-phase read operation to re-read the requested data. In some implementations, one or more functions or operations described with respect to the leakage correction circuitry 146 may be performed at the memory 104. In other implementations, the leakage correction circuitry 146 may be included in the memory 104.

The two phase read and/or write operation may include a first phase to determine an estimated amount of leakage current (e.g., an estimated interference level) of a neighborhood surrounding and/or including one or more storage elements to be read from and/or written to. A second phase may include performing the read and/or write operation using a mitigation parameter (e.g., a correction value or trim) that accounts for and attempts to mitigate the estimated amount of leakage current. The two phase read and/or write operation may take more time to perform than a read and/or write operation (e.g., a one stage read and/or write operation) that accounts for the predicted and/or expected amount of leakage current that may be experienced when leakage current is controlled using shaped data as described above. For example, a single phase write operation may include selecting a "default" leakage current mitigation setting, such as a default trim value, to adjust a voltage applied during the write operation. The leakage current mitigation setting may be selected based on the expected amount of leakage current rather than based on a measured leakage as in a two phase read operation. Reduced leakage current variability resulting from shaped data in the memory 104 may enable an increased proportion of one phase read and/or write operations to be performed in place of two phase read and/or write operations at the memory 104.

The host device 150 may include a processor and a memory. The memory may be configured to store data and/or instructions that may be executable by the processor. The memory may be a single memory or may include one or more memories, such as one or more non-volatile memories, one or more volatile memories, or a combination thereof. The host device 150 may issue one or more commands to the data storage device 102, such as one or more requests to erase, read data from, or write data to the memory 104 of the data storage device 102. For example, the host device 150 may be configured to provide data, such as the user data 152, to be stored at the memory 104 or to request data to be read from the memory 104. As another example, the host device 150 may be configured to send the erase command 154 to the data storage device 102 to erase one or more storage elements of the memory 104.

The host device 150 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 150 may communicate via a host controller, which may enable the host device 150 to communicate with the data storage device 102. The host device 150 may operate in compliance with a JEDEC Solid State Technology Association industry specification, such as an embedded MultiMedia Card (eMMC) specification or a Universal Flash Storage (UFS) Host Controller Interface specification. The host device 150 may operate in compliance with one or more other specifications, such as a Secure Digital (SD) Host Controller specification as an illustrative example. Alternatively, the host device 150 may communicate with the data storage device 102 in accordance with another communication protocol.

In operation, the controller 120 may receive the erase command 154 from the host device 150 to erase a portion of the memory 104, such as the group of storage elements 107. In response to the erase command 154, the shaper 130 may select a particular erase shaping scheme of the one or more erase shaping schemes 134. Application of the particular erase shaping scheme may cause a first number of storage elements of the portion of the memory to be programmed in a low-resistance state and/or a second number of storage elements of the portion to be programmed in a high-resistance state. For example, a first erase shaping scheme may be selected for one ratio of logical bit values (e.g., a balanced shaping having a ratio of approximately one) or a second erase shaping scheme may be selected for another ratio of logical bit value (e.g., an imbalanced shaping with a higher occurrence of one of the logical values than the other logical value).

Based on the particular erase shaping scheme, the shaper 130 may initiate the storage of shaped erase data into the portion of the memory 104. For example, the shaper 130 may generate the shaped erase data 124 and send the shaped erase data 124 to the portion of the memory 104. As another example, the shaper 130 may instruct the memory 104 (e.g., the read/write circuitry 110), to change data values of one or more storage elements, but less than all of the storage elements, included in the portion of the memory 104. The resulting data values stored at the portion of the memory 104 after changing the data values may be shaped erase data. As another example, responsive to the erase command 154, the shaper 130 may maintain shaped data stored at the portion of the memory 104 prior to receiving the erase command, such as shaped data that corresponds to a first number of storage elements in a low-resistance state and a second number of storage elements in a high-resistance state, where the first number and the second number are both positive integers.

In some implementations, the shaper 130 may be configured to store shaped erase data at the memory 104 without receiving an erase command. For example, the shaper 130 may be configured to cause shaped erase data to be stored at one or more storage elements of the memory 104 that are indicated as being unused based on the stored data index 144. To illustrate, after the data storage device 102 is initially powered on, such as for a first use of the data storage device 102, the shaper 130 may cause shaped erase data to be stored at each of the unused storage elements of the data storage device 102. In some implementations, after a power-up of the data storage device 102, the shaper 130 may cause shaped erase data to be stored at the unused storage elements of the data storage device 102. Alternatively, or in addition, after a power-up of the data storage device 102, the leakage tester 138 may be configured to test an amount of leakage current of unused storage elements and, for each storage element that fails the test performed by the leakage tester 138, the shaper 130 may cause shaped erase data to be stored at the storage element (and/or at neighboring storage elements).

Although one or more components of the data storage device 102 have been described with respect to the controller 120, in other implementations certain components may be included in the memory 104. For example, one or more of the shaper 130, the memory 140, the ECC engine 136, the leakage tester 138, and/or the leakage correction circuitry 146 may be included in the memory 104. Alternatively, or in addition, one or more functions as described above with reference to the controller 120 may be performed at or by the memory 104. For example, one or more functions of the shaper 130, the memory 140, the ECC engine 136, the leakage tester 138, and/or the leakage correction circuitry 146 may be performed by components and/or circuitry included in the memory 104.

FIG. 1 illustrates example operations and structures that may control leakage current experienced during read and/or write operations. For example, shaped data may be stored at one or more storage elements that are in an erased state (e.g., an unused state). The shaped data may be associated with a ratio of a first number of storage elements that are in a low-resistance state and a second number of storage elements that are in a high-resistance state. By storing shaped data throughout the memory 104, such as in used storage elements and unused storage elements, an amount of leakage current experienced during a read and/or a write operation may be controlled to be within a predicted and/or expected range. Accordingly, a majority of read and/or write operations performed on the memory 104 may be single phase read and/or write operations that account for the predicted and/or expected amount of leakage current.

Figure 2:
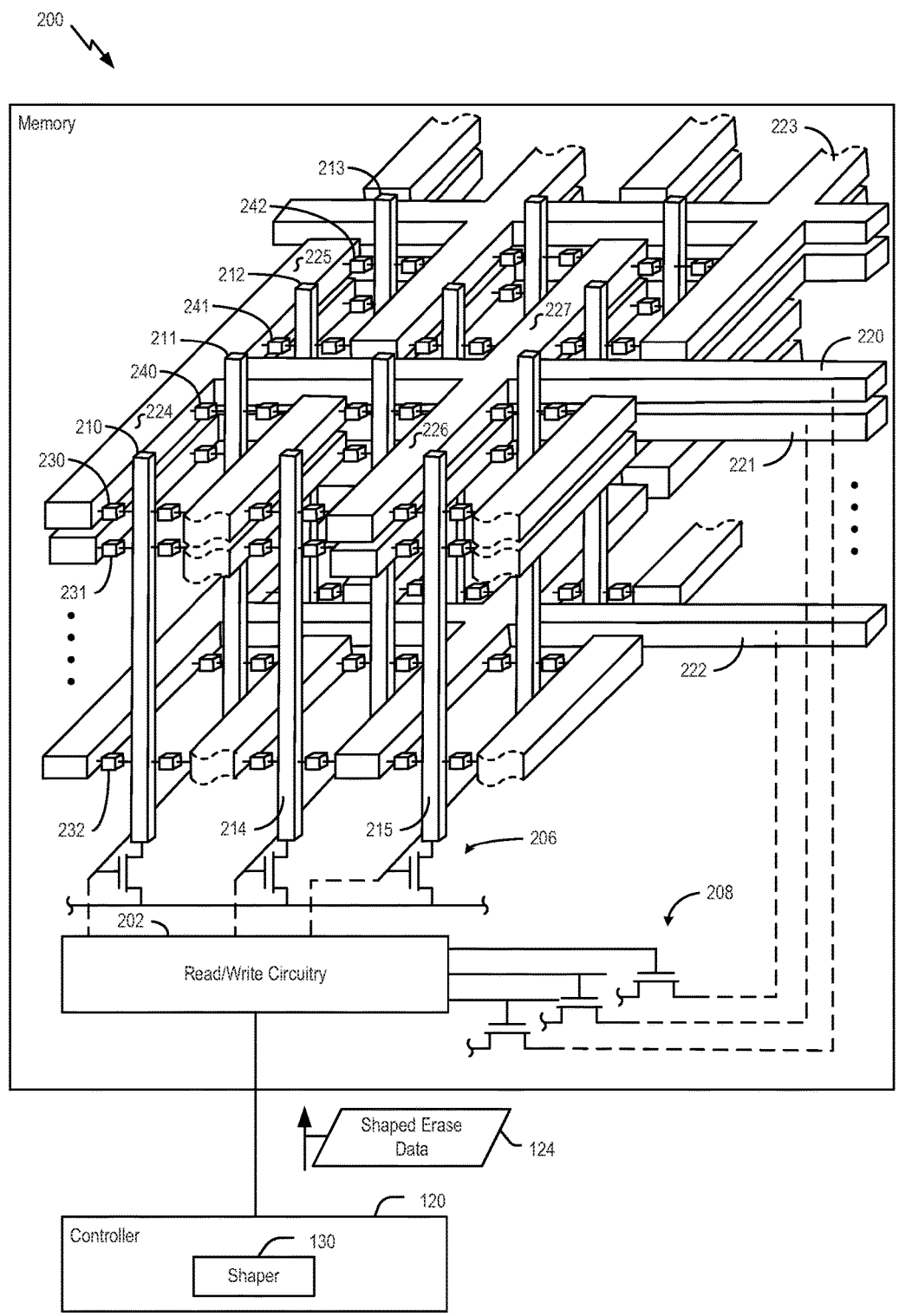
FIG. 2 is a block diagram of a particular embodiment of a memory that may be included in the data storage device of FIG. 1.

FIG. 2 is a diagram of a particular embodiment of a memory 200. The memory 200 may correspond to the memory 104 of FIG. 1. FIG. 2 illustrates a portion of a three-dimensional architecture of the memory 200 according to a particular embodiment. In the embodiment illustrated in FIG. 2, the memory 200 is a vertical bit line resistive random access memory (ReRAM). In addition, the example of FIG. 2 illustrates that the memory 200 may communicate with the controller 120 that includes the shaper 130. For example, the memory 200 may receive data, such as the shaped erase data 124, from the controller 120.

The memory 200 may include a plurality of conductive lines in physical layers over a substrate (e.g., substantially parallel to a surface of the substrate), such as representative word lines 220, 221, 222, and 223 (only a portion of which is shown in FIG. 2). The memory 200 may further include a plurality of vertical conductive lines through the physical layers, such as representative bit lines 210, 211, 212, 213, 214 and 215. The memory 200 also includes a plurality of resistance-based storage elements (e.g., memory cells), such as representative storage elements 230, 231, 232, 240, 241, and 242, each of which is coupled to a bit line and a word line in arrays of memory cells in multiple physical layers over the substrate (e.g., a silicon substrate).

The memory 200 also includes read/write circuitry 202. The read/write circuitry 202 may correspond to the read/write circuitry 110 of FIG. 1. The read/write circuitry 202 is coupled to word line drivers 208 and to bit line drivers 206.

In the embodiment illustrated in FIG. 2, each of the word lines includes a plurality of fingers. For example, a first word line 220 includes fingers 224, 225, 226, and 227. Each finger may be coupled to more than one bit line. To illustrate, a first finger 224 of the first word line 220 is coupled to a first bit line 210 via a first storage element 230 at a first end of the first finger 224 and the first finger 224 is coupled to a second bit line 211 via a second storage element 240 at a second end of the first finger 224.

In the embodiment illustrated in FIG. 2, each bit line may be coupled to more than one word line. To illustrate, the first bit line 210 is coupled to the first word line 220 via the first storage element 230 and the first bit line 210 is coupled to a third word line 222 via a third storage element 232.

During a write operation, the controller 120 may receive data from a host device, such as the host device 150 of FIG. 1. The controller 120 may send the data (or a representation of the data, such as the shaped user data 122 of FIG. 1) to the memory 200 to be stored. In a particular embodiment, the controller 120 encodes the data (e.g., to generate an ECC codeword), and the controller 120 sends the ECC codeword (or a shaped version of the ECC codeword) to the memory 200 to be stored.

During a read operation, the controller 120 may receive a request from a host device, such as the host device 150 of FIG. 1. For example, the request may be a read request and the controller 120 may cause the read/write circuitry 202 to read a data value from a particular storage element of the memory 200 by applying selection signals to selection control lines coupled to the word line drivers 208 and to the bit line drivers 206 to cause a read voltage to be applied across a selected storage element. For example, to select the first storage element 230, the read/write circuitry 202 may activate the word line drivers 208 and the bit line drivers 206 to apply a first voltage (e.g., 0.7 volts (V)) to the first bit line 210 and to word lines other than the first word line 220. A lower voltage (e.g., 0 V) may be applied to the first word line 220. Thus, a read voltage is applied across the first storage element 230, and a read current corresponding to the read voltage may be detected at a sense amplifier of the read/write circuitry 202. The read current corresponds (via Ohm's law) to a resistance state of the first storage element 230, which indicates a logical value stored at the first storage element 230.

As another example, the request may be an erase request and the controller 120 may send the shaped erase data 124 to the read/write circuitry 202. To illustrate, the shaped erase data 124 may be included in a write command that is sent to the read/write circuitry 202 to cause the read/write circuitry 202 to program the memory 200 with the shaped erase data 124.

Storing shaped erase data and shaped user data at the memory 200 substantially constrains leakage current to be within a predictable range of values. An estimated leakage current corresponding to the predictable range can be used to set a default voltage trim, reference current, or other parameter to be used with a single phase memory access operation (e.g., a read or write operation). The estimate of the leakage current may be sufficiently accurate to enable such single phase operations to have a relatively high probability of success, resulting in reduced average latency as compared to performing two phase operations that generate an estimate of the leakage current.

Figure 3:
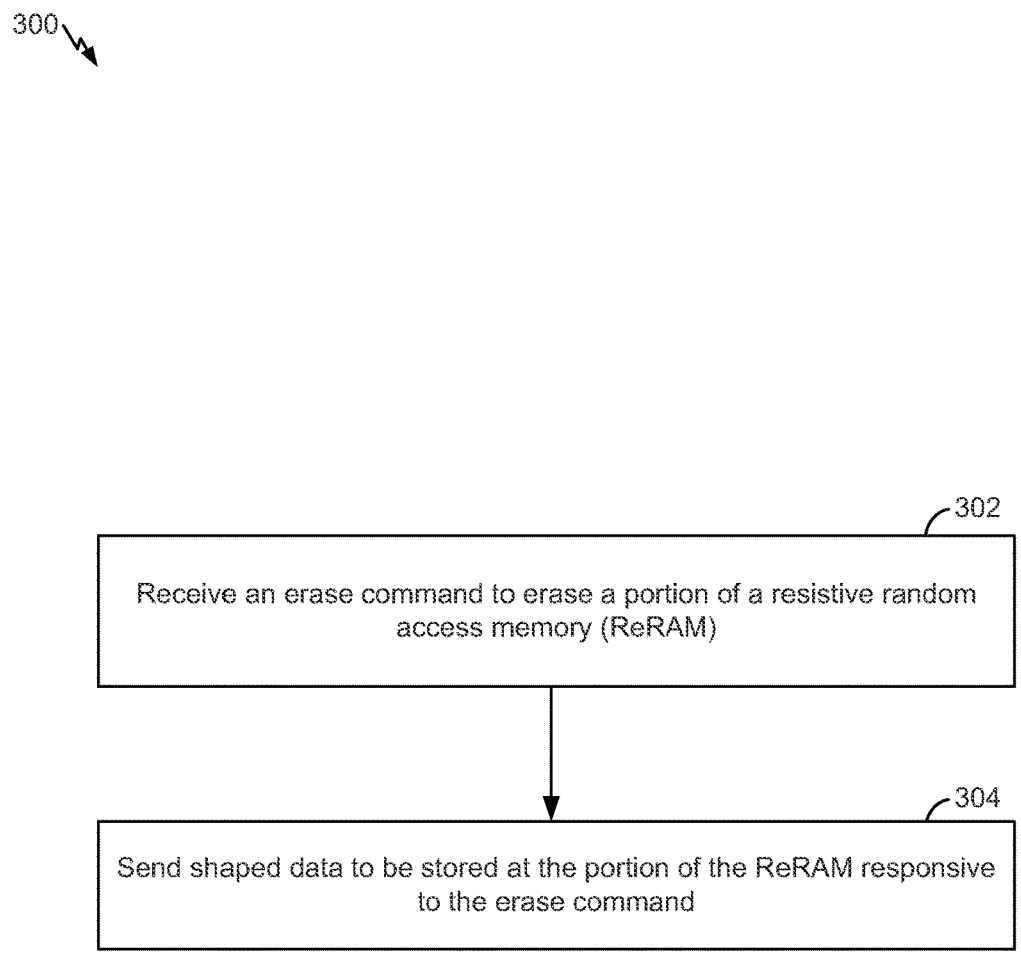
FIG. 3 is a flow diagram that illustrates a particular example of a method of operation of the data storage device of FIG. 1.

Referring to FIG. 3, a particular illustrative embodiment of a method is depicted and generally designated 300. The method 300 may be performed at the data storage device 102, such as by the read/write circuitry 110, the controller 120, or a combination thereof, as illustrative, non-limiting examples.

The method 300 includes receiving an erase command to erase a portion of a resistive random access memory (ReRAM), at 302. For example, the erase command may include or correspond to the erase command 154 of FIG. 1. The ReRAM may include or correspond to the memory 104 of FIG. 1 or the memory 200 of FIG. 2. The erase command may be received from a host device coupled to a data storage device, such as the host device 150 coupled to the data storage device 102 of FIG. 1. In some implementations, the erase command may be an erase word line command to erase a word line of the ReRAM and the word line may include the portion of the memory. To illustrate, the portion may include multiple storage elements and may correspond to a word line of the ReRAM.

The method 300 also includes sending shaped data to be stored at the portion of the ReRAM responsive to the erase command, at 304. The shaped data may include or correspond to the shaped erase data 124 of FIG. 1. In some implementations, the shaped data may include a first number of bits having a first bit value and a second number of bits having a second bit value. Each of the first number and the second number is greater than zero. For example, the shaped data may be associated with a pattern of first storage elements in a low-resistance state and second storage elements in a high-resistance state. As another example, the shaped data may include or correspond to a pseudo-random sequence of data values, such as a pseudo-random sequence of data values generated by a controller of the data storage device.

In some implementations, a determination may be made whether the erase command is associated with a soft erase (e.g., to indicate one or more storage elements as unused) or a hard erase (e.g., to change the data at one or more storage elements and to indicate that the one or more storage elements are unused), and the shaped data may be sent based on the erase command being associated with the hard erase. Alternatively, when the erase command is associated with a soft erase, a "valid" bit or some other mechanism may be used to indicate that the portion of the memory contains unused data, and user data (e.g., shaped data that was stored at the portion prior to the erase command being received) may be maintained at the portion of the memory without overwriting the user data with shaped "erase" data. For example, the stored data index 144 may be updated to indicate that a location of the memory 104 of FIG. 1 corresponding to the portion of the memory is unused. In other implementations, when different shaping schemes are used to generate and/or store shaped user data and shaped erase data, the data storage device 102 may not determine whether the erase command is associated with the soft erase or the hard erase. In this case, the stored data index 144 may be updated to indicate that the portion of the memory is unused, the shaped data may be generated using an erase shaping scheme, and the shaped data may be sent to be stored at the portion of the memory.

After the shaped data is stored at the portion of the memory, an amount of leakage current associated with the portion may be determined. For example, the amount of leakage current may be determined by the leakage tester 138 of FIG. 1. The amount of leakage current may be determined each time the shaped data is stored or according to other criteria, such as in response to a write counter value exceeding a write threshold. The amount of leakage current may be compared to a threshold, such as a threshold that includes or corresponds to the one or more leakage thresholds 142 of FIG. 1. The threshold may include a single value or a range of values. In response to the amount of leakage current failing to satisfy the threshold, second shaped data may be generated and sent to be stored at the portion of the memory to reduce the amount of leakage current by reducing the proportion of storage elements in the low-resistance state. To illustrate, when the shaped data results in a first statistical percentage of storage elements having the low-resistance state, the second shaped data may result in a second statistical percentage of storage elements having the low-resistance state, where the second statistical percentage is less than the first statistical percentage. In some implementations, the same shaping scheme may be used to generate the shaped data and the second shaped data. In other implementations, different shaping schemes may be used to generate the shaped data and the second shaped data.

Alternatively, or in addition, in some implementations, user data may be received to be stored at the memory, such as the user data 152 received from the host device 150 of FIG. 1. For example, the user data may be included in a write command. Shaped user data may be generated (based on the received user data) to be stored at a second portion of the memory and may be sent to the second portion. For example, the second portion may include or correspond to the group of storage elements 107 and the first portion may include or correspond to the group of storage elements 106 of FIG. 1. The shaped data may be configured to have a first statistical percentage of storage elements of the portion of the memory in a low-resistance state and the shaped user data may be configured to have a second statistical percentage of storage elements of the second portion of the memory in the low-resistance state. For example, the first statistical percentage and the second statistical percentage may be the same. To illustrate, the same shaping scheme may be used to generate the shaped data based on the erase command and to generate shaped user data based on the write command. As another example, the first statistical percentage may be different than the second statistical percentage. To illustrate, the first statistical percentage may be associated with a greater number of storage elements being in the low-resistance state as compared to the second statistical percentage.

In some implementations, after storing the shaped user data at the second portion of the memory, a second erase command may be received to erase the second portion of the memory. A determination may be made whether the second erase command is associated with a soft erase or a hard erase. In response to a determination that the second erase command is associated with the soft erase, the second portion may be indicated as being associated with unused data and the shaped user data may be maintained at the second portion of the memory. For example, the stored data index 144 may be updated to indicate that a location of the memory 104 of FIG. 1 corresponding to the second portion of the memory is unused.

By sending the shaped data to be stored at the portion of the memory responsive to the erase command, an amount of leakage current experienced during a read or write operation at one or more storage elements that neighbor the portion of the memory (e.g., storage elements that are adjacent to the portion of the memory) may be controlled. For example, the shaped data may be associated with a statistical ratio of one or more storage elements that are in a low-resistance state and one or more storage elements that are in a high-resistance state. By controlling the amount of leakage current (using the shaped data) to be a predicted and/or expected amount (e.g., within a range), leakage current experienced during programming or reading of user data may be accounted for and effects of the leakage current during the programming or reading can be mitigated, such as by adjusting a trim voltage value corresponding to the predicted amount of leakage current.

The method 300 of FIG. 3 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 300 of FIG. 3 can be initiated or controlled by one or more processors, such as one or more processors included in or coupled to a controller or a memory of the data storage device 102 and/or the host device 150 of FIG. 1. A controller configured to perform the method 300 of FIG. 3 may be able to send shaped data to be stored at a portion of a memory based on an erase command.

In an illustrative example, a processor may be programmed to receive an erase command to erase a portion of a resistive random access memory (ReRAM). For example, the processor may execute instructions to detect a command received via an interface and to compare an opcode of the received command to an opcode of an erase command. The processor may further execute instructions responsive to the erase command to send shaped data to be stored at the portion of the ReRAM. For example, the processor may execute instructions to send an enable signal to a random number generator (included in the shaper 130 of FIG. 1), route an output of the random number generator to a memory bus interface, and send a write command to a memory to write the output (e.g., shaped data) of the random number generator to the portion of the memory.

Although various components of the data storage device 102 and the host device 150 of FIG. 1 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 300 of FIG. 3. In a particular implementation, each of the controller 120, the memory 104, and/or the host 150 of FIG. 1 includes a processor executing instructions that are stored at a memory, such as a non-volatile memory of the data storage device 102 or the host device 150. Alternatively or additionally, executable instructions that are executed by the processor may be stored at a separate memory location that is not part of the non-volatile memory, such as at a read-only memory (ROM) of the data storage device 102 or the host device 150 of FIG. 1.

In an illustrative example, the processor may execute instructions to receive an erase command to erase a portion of a resistive random access memory (ReRAM). The instructions to receive the erase command may include instructions to determine whether the erase command is associated with a soft erase or a hard erase, instructions to identify the portion of the memory based on the erase command, instructions to change a used/unused indication that corresponds to the portion and that is maintained at a stored data index, instructions to identify a shaping scheme based on the erase command, instructions to identify a size of the portion of the memory, and/or instructions to generate shaped data, as illustrative, non-limiting examples. The processor may further execute the instructions to send shaped data to be stored at the portion of the ReRAM responsive to the erase command. The instructions to send the shaped data may include instructions to generate a write instruction that includes the shaped data, instructions to send the write instruction to the ReRAM, instructions to receive a confirmation after the shaped data is written to the portion of the memory, and/or instructions to initiate a leakage test associated with the portion of the memory after the shaped data is stored at the portion of the memory, as illustrative, non-limiting examples.

The data storage device 102 may be attached to or embedded within one or more host devices, such as within a housing of a host communication device (e.g., the host device 150). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other embodiments, the data storage device 102 may be implemented in a portable device configured to be selectively coupled to one or more external host devices.

To further illustrate, the data storage device 102 may be configured to be coupled to the host device 150 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   a resistive memory including multiple storage elements; and
   a controller coupled to the resistive memory, the controller configured to erase a portion of the resistive memory by storing shaped data into the portion, the shaped data configured to have a first statistical percentage of storage elements of the portion of the resistive memory in a low-resistance state and to cause at least a first storage element of the erased portion to have a high-resistance state, to control an amount of leakage current during a subsequent storage operation on a storage element adjacent to a storage element of the portion of the resistive memory, wherein the shaped data comprises a first number of bits having a first bit value and a second number of bits having a second bit value to set a proportion of storage elements of the erased portion having the low-resistance state so that a measured leakage current is below a threshold.

2. The device of claim 1, the controller further configured to set an indicator that the portion storing the shaped data is unused.

3. The device of claim 1, wherein the portion of the resistive memory corresponds to a word line of the resistive memory.

4. The device of claim 1, wherein the shaped data is invalid data having data values configured to control the amount of leakage current, and wherein a common shaping scheme is used to generate the invalid shaped data based on an erase command and to generate valid shaped user data based on a write command.

5. The device of claim 1, wherein the shaped data is associated with a pattern of first storage elements in a low-resistance state and second storage elements in a high-resistance state.

6. The device of claim 1, wherein the controller is further configured to generate a pseudo-random sequence of data values, and wherein the pseudo-random sequence of data values is used as the shaped data.

7. The device of claim 1, wherein the controller is further configured to determine whether a received erase command is associated with one of a soft erase and a hard erase, and wherein the shaped data is sent to the portion of the resistive memory based on a determination that the erase command is associated with the hard erase.

8. The device of claim 1, wherein the resistive memory comprises a resistive random access memory (ReRAM).

9. The device of claim 1, wherein the resistive memory comprises a first portion that stores shaped user data and a second portion that stores shaped erase data.

10. A method comprising:
    in a device including a resistive memory, performing:
        receiving, from an external device, an erase command to erase a portion of the resistive memory; and
        storing shaped data at the portion of the resistive memory responsive to the erase command, the shaped data comprising invalid data having data values configured to control an amount of leakage current during one of a read operation and a write operation at one or more storage elements that are adjacent to at least one storage element of the portion of the resistive memory.

11. The method of claim 10, wherein the erase command indicates performance of an erase operation on a page or a word line.

12. The method of claim 10, wherein the erase command is received from a host device coupled to the device.

13. The method of claim 10, further comprising:
storing shaped user data at a second portion of the resistive memory;
receiving a second erase command to erase the second portion of the resistive memory;
determining whether the second erase command is associated with one of a soft erase and a hard erase; and
in response to a determination that the second erase command is associated with the soft erase:
storing an indication that the second portion is associated with unused data; and
maintaining the shaped user data stored at the second portion of the resistive memory.

14. The method of claim 10, wherein the shaped data is configured to have a first statistical percentage of storage elements of the portion of the resistive memory in a low-resistance state.

15. The method of claim 14, further comprising:
receiving user data to be stored at the resistive memory;
generating shaped user data to be stored at a second portion of the resistive memory; and
sending the shaped user data to the second portion of the resistive memory.

16. The method of claim 15, wherein the shaped user data is configured to have a second statistical percentage of storage elements of the second portion of the resistive memory in the low-resistance state, and wherein the first statistical percentage is different than the second statistical percentage.

17. The method of claim 14, further comprising:
after storing the shaped data at the portion of the resistive memory, performing a leakage test to estimate an amount of leakage current associated with the portion; and
comparing the amount of leakage current to a threshold.

18. The method of claim 17, further comprising, in response to the amount of leakage current failing to satisfy the threshold:
generating second shaped data; and
sending the second shaped data to be stored at the portion of the resistive memory.

19. The method of claim 18, wherein the second shaped data is configured to have a second statistical percentage of storage elements of the portion of the resistive memory in the low-resistance state, and wherein the first statistical percentage is different than the second statistical percentage.

20. The method of claim 19, wherein the erase command is configured as an erase word line command.

21. An apparatus comprising:
means for data storage based on resistive states; and
means for storing shaped data into storage elements of a portion of the means for data storage that store user data, the shaped data configured to cause at least a first storage element of the portion to have a high-resistance state and at least a second storage element of the portion to have a low-resistance state to set a proportion of storage elements of the portion having the low-resistance state so that an amount of leakage current during a subsequent storage operation on a storage element adjacent to a storage element of the portion is below a threshold.

22. The apparatus of claim 21, wherein the means for storing is further configured to determine whether a received erase command is associated with one of a soft erase and a hard erase and to write the shaped data to the portion based on a determination that the erase command is associated with the hard erase.

23. The apparatus of claim 21, wherein the shaped data comprises a first number of bits having a first bit value and a second number of bits having a second bit value, and wherein each of the first number and the second number is greater than zero.

24. The apparatus of claim 21, wherein the means for data storage comprises a first region that stores shaped user data and a second region that stores shaped erase data.

* * * * *